United States Patent [19]

Ciszek

[11] Patent Number: 4,650,541
[45] Date of Patent: Mar. 17, 1987

[54] APPARATUS AND METHOD FOR THE HORIZONTAL, CRUCIBLE-FREE GROWTH OF SILICON SHEET CRYSTALS

[75] Inventor: Theodore F. Ciszek, Evergreen, Colo.

[73] Assignee: The United States of America as represented by the United States Department of Energy, Washington, D.C.

[21] Appl. No.: 649,627

[22] Filed: Sep. 12, 1984

[51] Int. Cl.⁴ .............................................. C30B 15/06
[52] U.S. Cl. ............................ 156/620; 156/DIG. 64; 156/DIG. 88; 156/DIG. 97; 422/249
[58] Field of Search ............. 156/608, 617 SP, 617 V, 156/617 M, 617 H, 619, 620, DIG. 64, DIG. 88, DIG. 97; 422/249

[56] References Cited

U.S. PATENT DOCUMENTS 4,226,834 10/1980 Shudo et al. ............... 156/DIG. 97
4,329,195 5/1982 Kudo ........................... 156/DIG. 97

FOREIGN PATENT DOCUMENTS 674121 11/1963 Canada ....................... 156/DIG. 64
52-62185 5/1977 Japan ............................. 156/617 H

OTHER PUBLICATIONS

Bleil; A New Method for Growing Crystal Ribbons; J. of Crystal Growth, 5(1969) 99–104.
Kudo; Improvements in the Horizontal Growth Technique for Single Crystal Silicon; J. of Crystal Growth 50, pp. 247–259 (1980).
Jewett et al; Progress in Growth of Silicon Ribbon by a Low Angle, High Rate Process; 17th IEEE Photovoltaic Specialist Conference, IEEE Press, pp. 86–89 (1982).

Primary Examiner—Barry S. Richman
Assistant Examiner—Michael S. Gzybowski
Attorney, Agent, or Firm—Kenneth L. Richardson; John M. Albrecht; Judson R. Hightower

[57] ABSTRACT

Apparatus for continuously forming a silicon crystal sheet from a silicon rod in a noncrucible environment. The rod is rotated and fed toward an RF coil in an inert atmosphere so that the upper end of the rod becomes molten and the silicon sheet crystal is pulled therefrom substantially horizontally in a continuous strip. A shorting ring may be provided around the rod to limit the heating to the upper end only. Argon gas can be used to create the inert atmosphere within a suitable closed chamber. By use of this apparatus and method, a substantially defect-free silicon crystal sheet is formed that can be used for microcircuitry chips or solar cells.

13 Claims, 8 Drawing Figures

APPARATUS AND METHOD FOR THE HORIZONTAL, CRUCIBLE-FREE GROWTH OF SILICON SHEET CRYSTALS

CONTRACTUAL ORIGIN OF THE INVENTION

The U.S. Government has rights in this invention under Contract No. DE-AC02-83CH10093 between the U.S. Department of Energy and the Solar Energy Research Institute, a Division of Midwest Research Institute.

BACKGROUND OF THE INVENTION

1. Field of the Invention

The present invention relates to an apparatus and method for the continuous growth of a silicon sheet crystal for use in the manufacture of microchips in computer circuits, solar cells, or other devices.

2. Description of the Prior Art

The general method used for forming a silicon sheet crystal is to melt a source of silicon in a crucible and to draw the sheet of silicon from the molten source, which is cooled and solidified. For the sheet growth to be rapid, the solid-liquid interface must be of a substantially greater area than the cross-section of the sheet. The heat of fusion is liberated over a large area and can readily be removed by radiation, convection or conduction. Currently available fast, sheet growth methods include growth by horizontal ribbon growth or low, angle silicon sheet growth. These methods consist of holding the silicon melt in a quartz crucible and growing the ribbon laterally (within about 10° of horizontal) from the melt surface. Passive thermal modifiers, such as scrapers and inert gas cold shoes are used in an attempt to control the thermal environment of the sheet. The difficulty with these techniques is that a dendritic growth morphology degrades the ribbon quality, resulting in considerable waste.

Other fast, sheet growth methods include spin-casting the liquid on rapidly rotating horizontal disc or cylindrical wheel surfaces. None of these methods have been found entirely satisfactory for the creation of a uniform silicon sheet crystal that can be used as a substrate for computer chips or solar cells.

SUMMARY OF THE INVENTION

To achieve the foregoing other objects and in accordance with the purpose of the present invention, as embodied and broadly described herein, the apparatus of this invention comprises an economical commercial process for forming a continuous silicon sheet crystal.

It is another general object of the invention to form the continuous silicon sheet crystal without substantial defects.

It is a further general object to form the continuous silicon sheet crystal by means of a noncrucuible process.

It is a more specific object of the invention to form a continuous silicon sheet crystal from a silicon rod.

It is a further, more specific object of the invention to form a continuous silicon sheet crystal using a radio frequency RF coil to heat at least a portion of the end of the rod to molten state in an inert atmosphere while the rod is rotated and fed toward the RF coil. The silicon sheet is simultaneously pulled from the molten silicon as it is cooled to form the continuous sheet.

Additional objects, advantages and novel features of the invention shall be set forth in part in the description that follows, and in part will become apparent to those skilled in the art upon that examination of the following or may be learned by the practice of the invention. The object and the advantages of the invention may be realized and attained by means of the instrumentalities and in combinations particularly pointed out in the appended claims.

More particularly, the method of this invention is accomplished by means of apparatus for crucible-free growth of a sheet crystal of silicon. This apparatus comprises means for providing a substantially enclosed space having an inert atmosphere. Heating means is provided for sequentially forming molten silicon from a source of substantially pure silicon within the space. Means is also provided for vertically feeding the silicon source toward the heating means to form a molten layer of silicon at the top of the source, and means are provided for drawing a continuous silicon sheet crystal from the molten silicon layer within the space.

BRIEF DESCRIPTION OF THE DRAWINGS

The accompanying drawings, which are incorporated in and form a part of the specification, illustrate preferred embodiments of the present invention, and together with the description, serve to explain the principles of the invention. In the drawings.

DETAILED DESCRIPTION OF THE PREFERRED EMBODIMENTS

Figure 1:
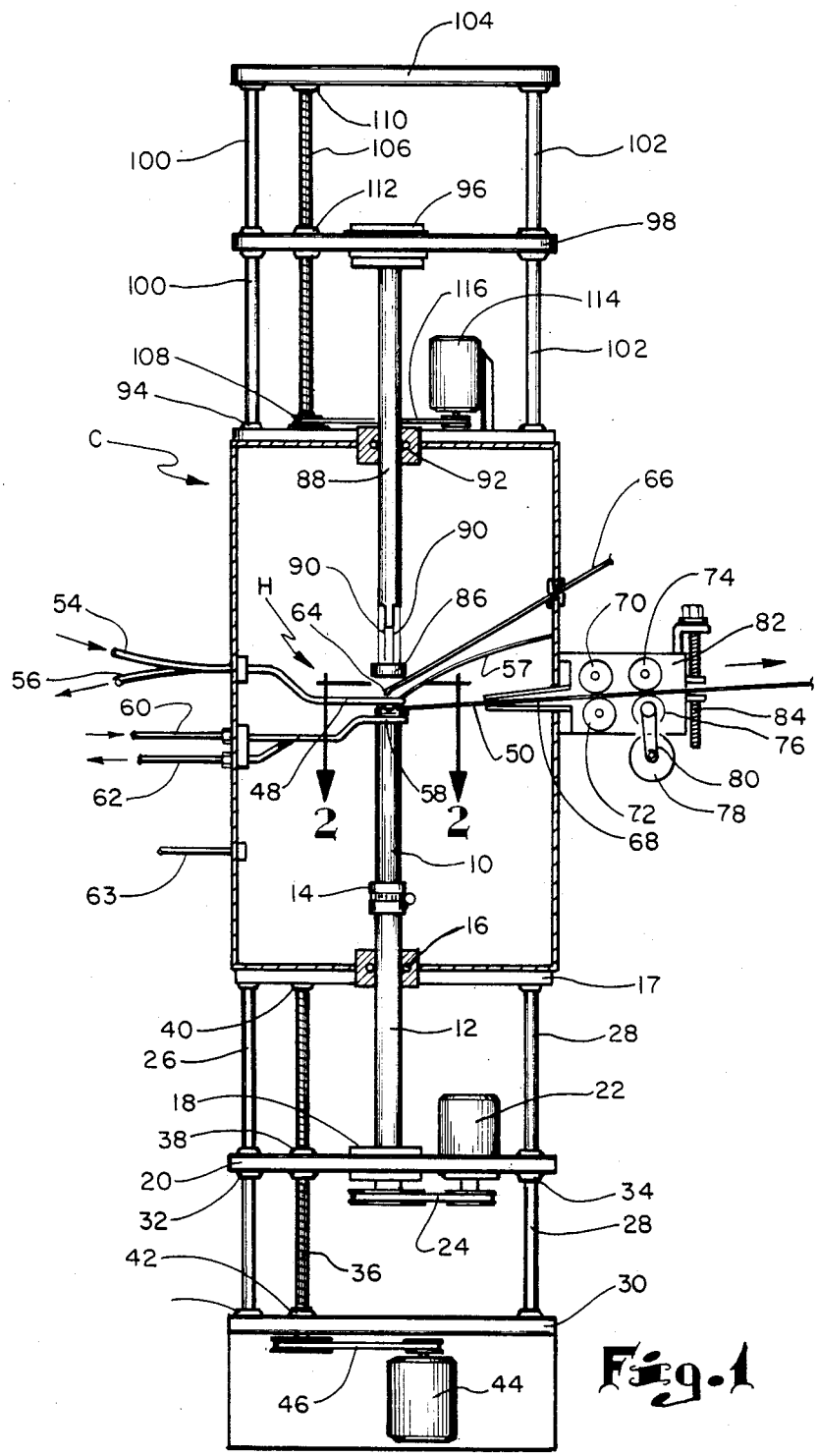
FIG. 1 is a vertical section through a chamber having a controlled atmosphere and containing apparatus for carrying out the method of this invention.

In accordance with this invention, a closed chamber C is provided in which the atmosphere can be controlled. A silicon rod 10 is mounted on a vertically movable post 12 by means of a clamp 14. The post 12 extends through a seal 16 in the bottom 17 of the chamber and is rotatably supported in a bearing 18 on a platen 20. The post 12 and attached silicon rod 10 can be rotated by means of motor 22 through pulley 24, as shown. Platen 20 is vertically movable along support rods, such as support rods 26 and 28. It will be understood that while only two support rods have been illustrated, three or four such rods would be adequate to support chamber C above base 30 to which the lower end of the rods are connected. Conveniently, platen 20 has bearings 32 and 34, respectively, for facilitating sliding movement along support rods 26 and 28.

Vertical movement of platen 20 and hence post 12 and silicon rod 10 is accomplished by means of lead screw 36 rotatably supported in bearings 40 and 42 on chamber bottom 17 and base 30, respectively, and extended through threaded coupling 38 in platen 20. The lead screw is rotated by reversible motor 44 connected thereto by means of pulley 46 to control vertical movement in either direction of platen 20 as well as post 12 and silicon rod 20.

An RF heating coil H is fixedly mounted above the upper end of rod 10, which includes a coil 48 extending above the upper end of silicon rod 10 for heating the same to a molten state for forming a silicon sheet crystal 50, as will be more fully described below. Heating coil H is connected externally of chamber C through electrical leads 54 and 56 to an RF generator (not shown) operating at a frequency between 1 to 4 MHz. The electrical leads also serve as water supply pipes for cooling the heating coil. A grounding wire 57 extends from coil 48, to the wall of chamber C.

For some applications, a shorting ring 58 will be provided that surrounds rod 10 below its upper end and is supplied externally with cooling water through tubes 60 and 62. The purpose of the shorting ring will be discussed more fully below.

An inert gas, such as argon, is supplied to chamber C through a conduit 63 from an argon supply (not shown). Additional argon gas may be supplied through gas nozzle 64, made of any suitable material such as fused quartz, which is connected to an external source of argon (not shown) through tubing 66. The gas nozzle 64 cools the molten silicon as sheet crystal 50 is formed. This feature will be described more fully below. Argon gas is continually purged through the chamber and exits through silicon sheet discharge opening 68. The laminar flow of the argon gas through opening 68 is at sufficient volume to inhibit any backflow of air into the chamber. It has been found that a flow of 5 to 10 ft$^3$/h is satisfactory and that the pressure within the chamber is less than 1 psi above atmosphere.

Silicon sheet 50 is drawn through discharge opening 68, by means of spaced pairs of rollers 70 and 72, and 74 and 76, respectively. These rollers are driven, by means of a motor 78 through a drive means, such as drive belt 80. It will be understood that a similar drive belt can also be connected to roller 72, but is omitted for clarity of illustration. The silicon sheet can be pulled at any desired speed up to about 750 mm per minute. The faster the flow of the argon stream through jet 64, the faster the sheet can be pulled. Also the less RF power to RF heating coil H the greater the speed at which the sheet can be drawn. The drive roller support 82 can be vertically adjusted, as by adjustment screw 84, which will permit an adjustment of the angle of silicon sheet 50 as it is drawn from the molten material at the upper end of silicon rod 10. The purpose of this adjustment will be more fully explained below.

In order to initially heat the upper end of silicon rod 10 to a temperature where its conductivity is high enough to couple directly to the RF coil, a graphite disc heater 86 is suspended above heating coil H from vertically movable post 88 by means of support wires 90. Conveniently, post 88 is slidably movable through seal 92 in upper plate 94 on chamber C. The upper end of post 88 is rotatably mounted in a bearing 96 of vertically movable platen 98. The platen is supported on a plurality of support rods, such as support rods 100 and 102 that extend between plate 94 and top plate 104. Although only two support rods have been shown, it will be understood that three or four can conveniently be utilized to provide proper support for the structure. A lead screw 106 is rotatably supported in bearings 108 and 110 and upper plate 94 and top plate 104, respectively. The lead screw 106 extends through a threaded coupling 112 in platen 98 and is driven by a reversible motor 114 that is connected to the lead screw through a pulley 116 for vertically moving platen 98 as well as post 88 and silicon disc 86 suspended therefrom.

Figure 2:
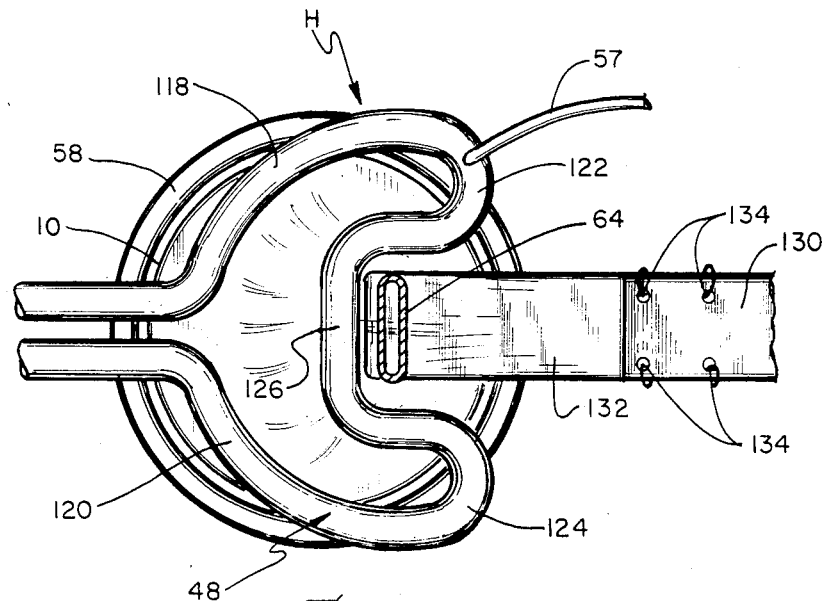
FIG. 2 is an enlarged horizontal section, taken along line 2—2 of FIG. 1, showing one form of an RF coil used in this invention.
Figure 3:
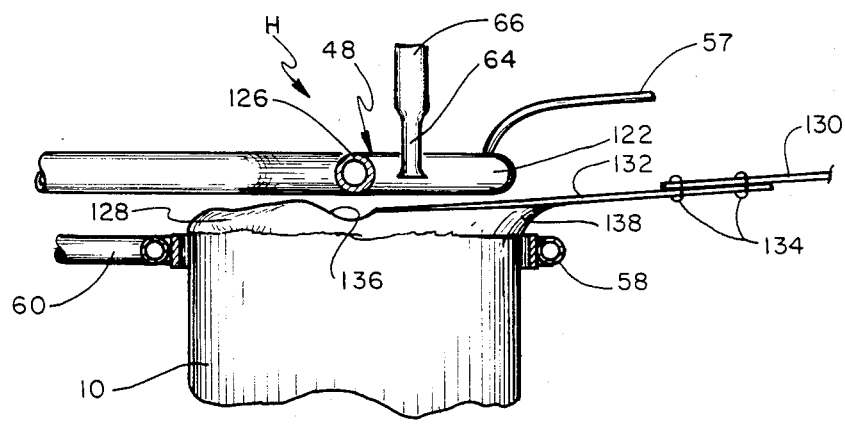
FIG. 3 is a side elevation of the apparatus of FIG. 2.

The operation of the apparatus of this invention and the method of forming a silicon crystal sheet will be apparent from a review of FIGS. 2 and 3. As previously stated, the upper end of rod 10 is heated by RF heating coil H. Rod 10 is continuously rotated at a speed that can vary from 3 to 20 rpm. A speed of 10 rpm has been found to be very satisfactory. RF heating coil H includes a coil element 48 having a generally U-shaped configuration that, as viewed in FIG. 2, has outer curved portions 118 and 120 that curve back upon themselves forming sharp bends 122 and 124, respectively, and are joined together by a straight, central portion 126. The radio frequency signal passing through coil 48 magnetically induces a current to flow in the top of silicon rod 10, and resistance of the rod to the flow of current gives rise to heat, which forms a molten top surface 128. The portion of the rod top that rotates under the enclosed area of the coil undergoes intense RF heating bringing the upper end of the rod to its melting point of 1412° C. The portion that is outside the enclosed region is not actively heated. The silicon sheet crystal grows from this cooler region as will be more fully explained.

To begin the process of forming the silicon sheet crystal, a stainless steel strip 130 is fed into chamber C through discharge opening 68 by the drive rollers and reversible motor 78. Strip 130 has a short seed single crystal silicon tab 132 attached thereto, as by wires 134. This tab 132 is brought in contact with the molten upper surface 128 of rod 10 by angularly adjusting drive roller support 82 by means of adjustment screw 84 so as to lower silicon seed strip 132 down onto the molten silicon so that it adheres thereto. As rod 10 rotates, stainless steel strip 130 will be pulled from chamber C by reversing motor 78, and molten silicon that adheres to seed strip 132 will solidify forming a silicon crystal sheet that can be used for forming microchips, solar cells, or other electronic circuit elements.

Two effects define the leading edge portion of the drawing sheet. One is the large temperature gradient that exists between the area outside the enclosed loop of the coil and the area inside the loop. The other effect is the depression 136 of the melt surface due to RF repulsion along straight section 126. The regions of melt immediately under section 126 of RF coil 48 carry a current moving in the opposite direction to that in the coil. Because of this action, the melt surface is free to rearrange under this force and become depressed in this region. The melt has a relatively high mesa in the cooler area in the opening of the U-shaped portion, where the sheet solidifies, but has a valley under the straight section 126 of the tubing. This effect, with the temperature gradient, defines the leading edge of the silicon crystal sheet.

Cooling of the crystal sheet also can be enhanced by supplying argon gas through nozzle 64 to the upper surface of the rod adjacent to coil section 126. As seen in FIG. 2, the nozzle is shaped to provide a stream of cooling gas across the width of the crystal sheet. A gas flow up to about 5 ft³/h has been found to be satisfactory.

As described above, the rod can be moved upwardly by reversible motor 44 of FIG. 1. The speed at which it is moved depends on the sheet width, thickness and growth velocity as well as the diameter of the silicon rod. If the sheet has a width W, a thickness T and a growth velocity V, then a feed rod having a diameter D should be moved upwardly at a speed S to maintain steady-state continuous growth conditions:

$$S = \frac{4\ WTV}{\pi D^2}$$

Figure 4:
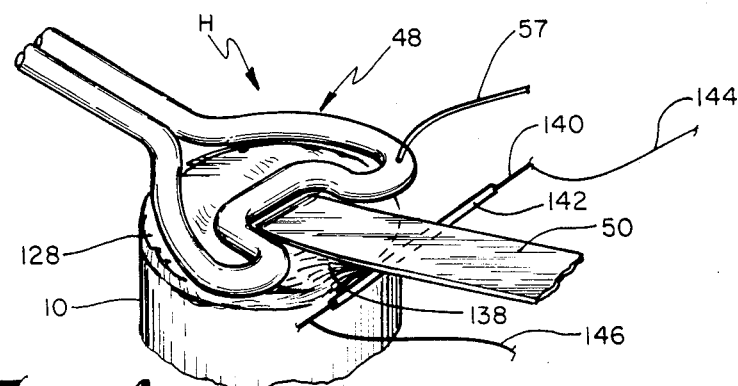
FIG. 4 is a fragmentary perspective view showing the use of a graphite rod to control the meniscus from the molten silicon.

It is contemplated that when using a silicon rod having a 48 to 50 mm diameter, that the width of the silicon crystal sheet would be on the order of 18 mm. As the silicon sheet is pulled from the molten surface 128, a meniscus 138 is formed in the area of pull, as best seen in FIG. 3. There is a tendency for this meniscus to spill over the side of the rod and to cause defects in the bottom surface of the silicon crystal sheet. In the embodiment of FIG. 4, a graphite rod 140 is provided underneath silicon crystal sheet 50 at the meniscus and is provided with a quartz sheath 142 that serves to support the meniscus and to allow the sheet to be pulled from the surface 128 without distortions or defects in the sheet. Leads 144 and 146 extend from opposite ends of graphite rod 140 and are connected to a suitable variable source of AC or DC power for heating the graphite rod to a temperature of 1,000° to 1,500° C.

Figure 5:
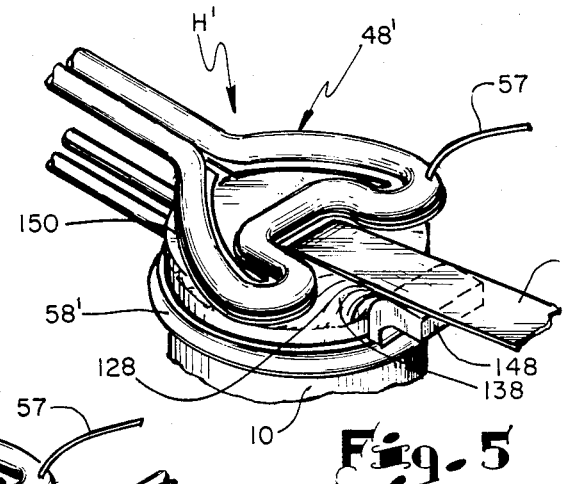
FIG. 5 is a fragmentary perspective view, similar to FIG. 4 but showing the use of a shorting ring having a plate to control the meniscus of the molten silicon.

Another concept for supporting the meniscus is shown in FIG. 5 wherein a shorting ring 58' includes a shaped copper block 148 that supports the meniscus 138 in much the same manner as quartz rod 140. Block 148 is chilled by water circulating through shorting ring 58'. In this embodiment, an RF heating coil H' is provided that has a coil element 48' with a flat conducting plate 150 attached to the bottom thereof, as by braising or welding, for distributing heat more evenly to the upper molten surface 128 of silicon rod 10.

Figure 7:
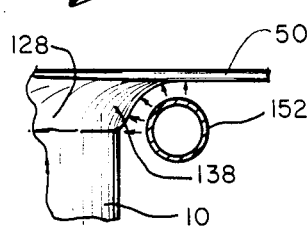
FIG. 7 is a fragmentary, enlarged, vertical section, taken along line 7—7 of FIG. 6, showing the repulsion forces exerted by the secondary RF coil.
Figure 6:
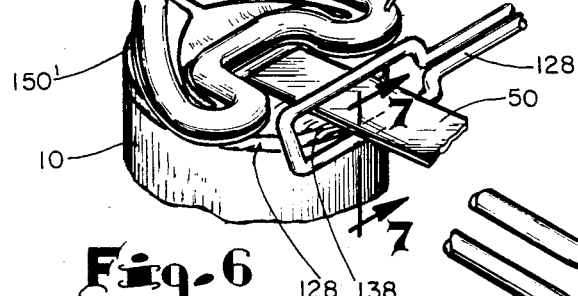
FIG. 6 is a fragmentary perspective view, similar to FIGS. 4 and 5, but showing the use of a secondary RF coil to control the meniscus of the molten silicon.

In the embodiment of FIG. 6, the repulsive force created by an RF coil is utilized to support the meniscus. In this arrangement, an RF coil 152, which is much smaller in diameter than RF coil 48', extends around silicon crystal sheet 50 with the lower portion thereof adjacent to the meniscus so as to repel it with a repulsion force holding it up so that there is less likelihood of defects being formed in the bottom of sheet 50 as it is drawn from molten surface 128. The effect of the repulsive force created by coil 152 can be seen in FIG. 7.

Figure 8:
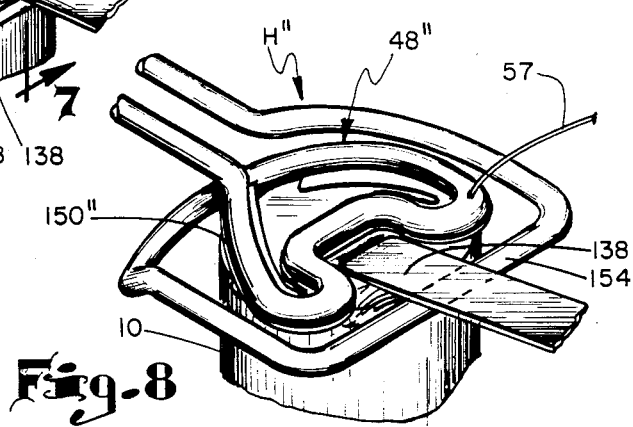
FIG. 8 is a fragmentary perspective view, similar to FIGS. 4-6, but showing an RF coil having a reverse loop.

An alternative RF heating coil H" is shown in FIG. 8, that includes a coil element 48" which has formed integrally therewith an additional or outer loop 154 extending around the outside of inner coil element 48". With this arrangement, the radio frequency current in outer loop 154 and the current that it induces in the meniscus region 138 are in opposite directions causing again a repulsive supporting force on the meniscus similar to that shown in FIG. 7. Also, inner coil element 48" may be provided with a flat plate 150" to further enhance distribution of the heat across the top of the rod.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to falling within the scope of the invention as defined by the claims that follow.

The embodiments of the invention in which an exclusive property or privilege is claimed are defined as follows:

1. Apparatus for crucible-free growth of a sheet crystal of silicon, said apparatus comprising;
    means for providing a substantially enclosed space having an inert atmosphere;
    heating means for sequentially forming molten silicon from a source of substantially pure silicon within the space;
    means for vertically feeding a silicon source toward said heating means to form a molten layer of silicon at a top of the source;
    means for drawing a continuous silicon sheet crystal from the molten silicon layer within the space; wherein a meniscus of molten silicon is created by said drawing means, said apparatus including means to control the shape of the meniscus, and wherein said controlling means includes a repulsive RF generator for repulsive support of the meniscus as a molten silicon sheet crystal is drawn from the molten silicon.

2. Apparatus, as claimed in claim 1, wherein the silicon source is in the form of a feed rod and said feeding means comprising:
    means for rotating said feed rod.

3. Apparatus, as claimed in claim 1, wherein said drawing means comprises:
    feed rollers for pulling the sheet crystal continuously from the molten silicon.

4. Apparatus, as claimed in claim 1, wherein said means for providing the inert atmosphere include:
    means providing an argon atmosphere around the molten silicon.

5. Apparatus, as claimed in claim 1, wherein said controlling means includes:
    a chilled block for supporting the meniscus as the molten silicon sheet crystal is drawn from the molten silicon.

6. Apparatus, as claimed in claim 1, wherein said controlling means further includes:
    an electrically heated graphite rod having a quartz sheath for supporting the meniscus as the molten silicon sheet cyrstal is drawn from the molten source.

7. Apparatus, as claimed in claim 1, further including:
    a nozzle for directing an inert gas against the leading edge of the sheet crystal to cool the same.

8. Apparatus, as claimed in claim 1, further including:
    means for limiting the heating of the silicon source below the layer of molten silicon.

9. Apparatus, as claimed in claim 8, wherein said limiting means includes:
    an RF shorting ring, substantially surrounding the silicon source.

10. Apparatus for crucible-free growth of a sheet crystal of silicon, said apparatus comprising:
    means for providing a substantially enclosed space having an inert atmosphere;
    heating means for sequentially forming molten silicon from a source of substantially pure silicon within the space;

means for vertically feeding a silicon source toward said heating means to form a molten layer of silicon at the top of the source;

means for drawing a continuous silicon sheet crystal from the molten silicon layer within the space, feeding means comprising means for rotating a feed rod, and wherein said heating mean comprises an RF coil having a generally U-shape configuration for heating a localized area of a top of a rod and providing access for said drawing means to a remaining area of the top of the rod so that a silicon sheet crystal is formed as the molten silicon begins to cool due to the rotation of the rod to move the molten silicon from the localized area to the remaining area, and wherein said coil further includes an additional RF loop around the outside of said U-shaped coil to provide support for the meniscus from which the sheet solidifies.

11. Apparatus, as claimed in claim 10, wherein:
said RF coil includes an extended plate area to provide substantially uniform distribution of heat over the localized area.

12. An apparatus for crucible-free non-dendritic growth of a silicon crystal sheet from a rod-like source of substantially pure silicon having an end, said apparatus comprising:

RF heating means for continuously forming molten silicon from a rod-like source of substantially pure silicon having an end;

means for vertically feeding the end of the silicon source toward said RF heating means;

said RF heating means comprising a single coil element having a generally U-shaped configuration, said single coil element defining two generally parallel transversely spaced longitudinally extending coil element sections, said two coil element sections extending longitudinally from a first end of said single coil element to a second end thereof and being curved back from said second end so as to form a generally straight tranversely extending central coil element section, said central coil element section being positioned intermediate said first and second end, said central coil section, said first end, and said two longitudinally extending coil sections forming a gap that defines a first enclosed portion of said RF heating means, said two coil element sections longitudinally extending from said central coil section to said second end defining a second portion of said RF heating means, wherein said first portion of said RF heating means, during heating, intensely heats a first region of the end of the silicon source to its melting temperature and thereby causes said first region to be depressed, and wherein the second portion of said RF heating means is shaped such that, during heating, a second portion of the end of the silicon source remains outside of said first enclosed portion of said RF heating means to prevent active heating of said second portion of the end of the silicon source thereby causing said second region to form a mesa and to be sufficiently cool with respect to said first region so as to enable growth of a non-dendritic silicon crystal sheet, and wherein said RF heating means, during heating, causes a leading edge portion to form at the end of the silicon source; and means for horizontally drawing a continuous non-dendritic silicon crystal at the edge portion.

13. A crucible-free, non-dendritic growth method for continuously forming a silicon crystal sheet from a rod of substantially pure silicon, said method comprising:

employing an RF heating means having first and second portions to provide a molten layer at an end of the silicon rod in an inert atmosphere by actively heating a first region at the end of the silicon rod while preventing an active heating of a second region of said end of the silicon rod;

rotating said pure silicon rod while actively heating said first region with the first portion of said RF heating means and while preventing the active heating of said second region with said second portion of said RF heating means, so as to cause said first region to be depressed and to cause said second region to have a mesa and be sufficiently cooler than the first region so as to enable a growth of said non-dendritic silicon crystal sheet;

providing said molten layer with a leading edge for growing therefrom said non-dendritic silicon crystal sheet, through said heating with said RF heating means, such that said leading edge is defined by the effects of a temperature gradient existing between the cooler mesa region and the first region of the molten layer; and horizontally drawing a continuous non-dendritic silicon crystal sheet at said leading edge.

* * * * *